United States Patent
Rayaprolu et al.

(10) Patent No.: US 11,270,772 B1
(45) Date of Patent: Mar. 8, 2022

(54) VOLTAGE OFFSET BIN SELECTION BY DIE GROUP FOR MEMORY DEVICES

(71) Applicant: Micron Technology, Inc., Boise, ID (US)

(72) Inventors: Vamsi Pavan Rayaprolu, San Jose, CA (US); Mustafa N. Kaynak, San Deigo, CA (US); Michael Sheperek, Longmont, CO (US); Larry J. Koudele, Erie, CO (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/008,225

(22) Filed: Aug. 31, 2020

(51) Int. Cl.
*G11C 16/10* (2006.01)
*G06F 12/06* (2006.01)
*G11C 16/08* (2006.01)

(52) U.S. Cl.
CPC ............ *G11C 16/107* (2013.01); *G06F 12/06* (2013.01); *G11C 16/08* (2013.01)

(58) Field of Classification Search
CPC ... G11C 11/5642; G11C 16/08; G11C 16/107; G11C 29/028; G11C 29/50004; G06F 12/06
See application file for complete search history.

(56) References Cited

U.S. PATENT DOCUMENTS

| | | | |
|---|---|---|---|
| 5,497,381 A * | 3/1996 | O'Donoghue | H01L 22/20 257/E21.525 |
| 10,236,070 B2 * | 3/2019 | Barndt | G11C 16/3427 |
| 2021/0065813 A1 * | 3/2021 | Papandreou | G06F 3/0632 |

* cited by examiner

*Primary Examiner* — Ajay Ojha
(74) *Attorney, Agent, or Firm* — Lowenstein Sandler LLP

(57) ABSTRACT

One or more blocks at the memory device are programed. The one or more blocks are associated with a block family and with one or more dice of a die group. A voltage offset bin associated with the die group and the block family is determined based on a subset of dice of the die group. Metadata associated with the memory device is appended to include a record associating the die group and the block family with the voltage offset bin.

20 Claims, 8 Drawing Sheets

DIE GROUP TABLE 310

| Index (Die) | Die Group A | Die Group B | ... | Die Group N |
|---|---|---|---|---|
| 1 | x | | | |
| 2 | x | | | |
| 3 | x | | | |
| 4 | x | | | |
| 5 | x | | | |
| ... | | | | |
| 20 | | | | |
| 21 | | | | x |
| 22 | | | | x |
| ... | | | | |
| 62 | | | | |
| 63 | | | | x |
| N | | | | |

FAMILY TABLE 320

| Index (DF) | Die Group A (die 0-9) | Die Group B (die 10-15) | ... | Die Group N (die 26-N) |
|---|---|---|---|---|
| 1 | 1 | 6 | | 4 |
| 2 | 1 | 6 | | 4 |
| 3 | 1 | | | |
| 4 | 1 | | | |
| 5 | 1 | | | |
| ... | | | | |
| 20 | | | | |
| 21 | | | | |
| 22 | | | | |
| ... | | | | |
| 62 | | | | |
| 63 | | | | |

DIE GROUP A OFFSET TABLE 330

| Level/Bin | Bin 0 | Bin 1 | Bin 2 | Bin 3 | Bin 4 | Bin 5 | Bin 6 | Bin 7 |
|---|---|---|---|---|---|---|---|---|
| L1 | V10 | V11 | V12 | V13 | V14 | V15 | V16 | V17 |
| L2 | V20 | V21 | V22 | V23 | V24 | V25 | V26 | V27 |
| L3 | V30 | V31 | V32 | V33 | V34 | V35 | V36 | V37 |
| L4 | V40 | V41 | V42 | V43 | V44 | V45 | V46 | V47 |
| L5 | V50 | V51 | V52 | V53 | V54 | V55 | V56 | V57 |
| L6 | V60 | V61 | V62 | V63 | V64 | V65 | V66 | V67 |
| L7 | V60 | V61 | V62 | V63 | V64 | V65 | V66 | V67 |

VOLTAGE OFFSET BIN SELECTION BY DIE GROUP FOR MEMORY DEVICES

TECHNICAL FIELD

Embodiments of the disclosure are generally related to memory sub-systems, and more specifically, are related to voltage offset bin selection by die group for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of some embodiments of the disclosure.

FIG. 3 schematically illustrates example metadata maintained by the memory sub-system controller for associating die groups with block families, in accordance with embodiments of the disclosure.

DETAILED DESCRIPTION

Figure 1:
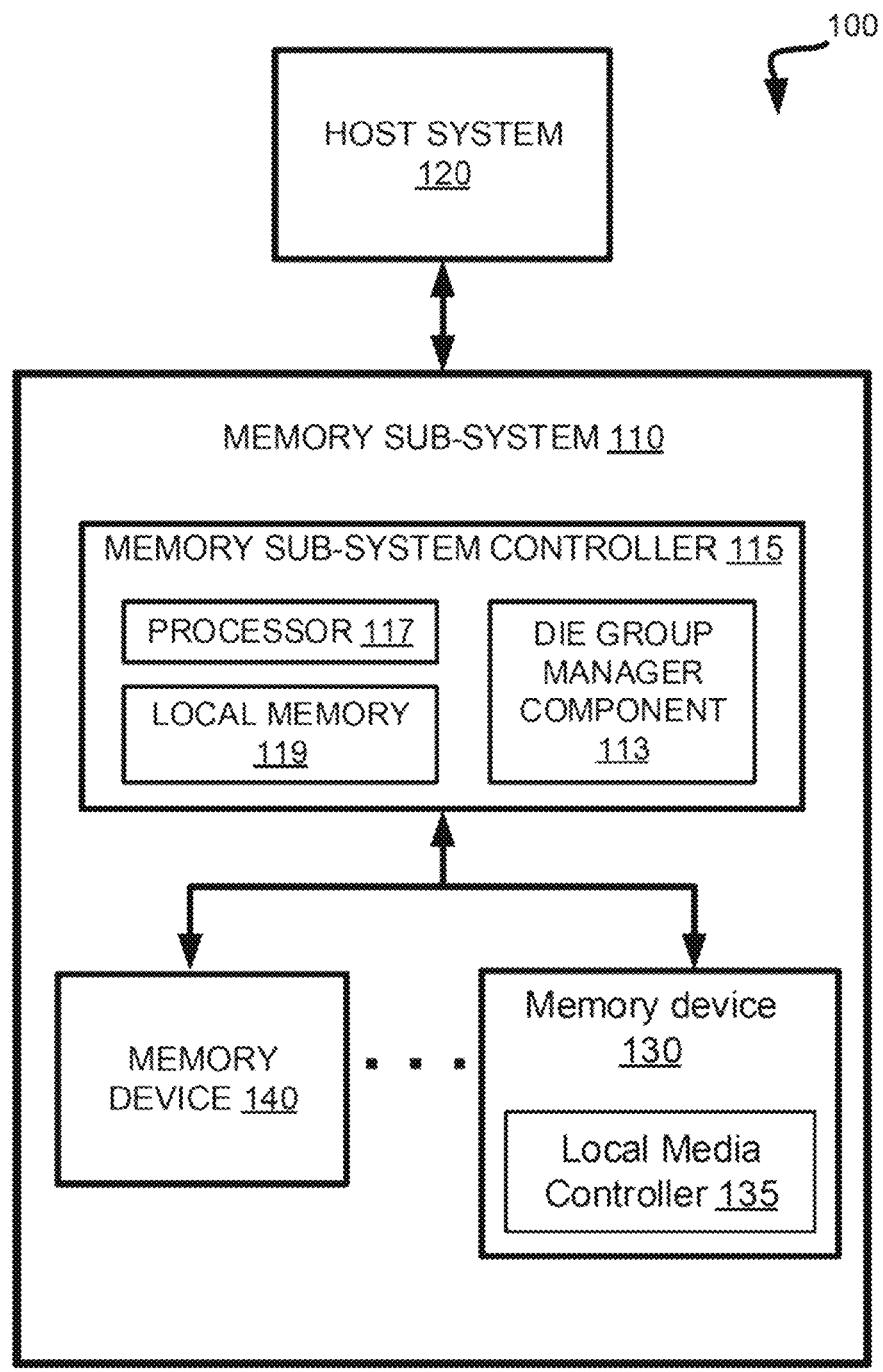
FIG. 1 illustrates an example computing system that includes a memory sub-system, in accordance with some embodiments of the disclosure.

Embodiments of the disclosure are directed to voltage offset bin selection by die group for memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

"Block" herein shall refer to a set of contiguous or non-contiguous memory pages. An example of "block" is "erasable block," which is the minimal erasable unit of memory, while "page" is a minimal writable unit of memory. Each page includes of a set of memory cells ("cells"). A memory cell is an electronic circuit that stores information.

A memory sub-system can utilize one or more memory devices, including any combination of the different types of non-volatile memory devices and/or volatile memory devices, to store the data provided by the host system. In some embodiments, non-volatile memory devices can be provided by not-and (NAND) type flash memory devices. Other examples of non-volatile memory devices are described below in conjunction with FIG. 1. A non-volatile memory device is one or more packages of one or more dice. Each die can consist of one or more planes. Planes can be groups into logic units (LUN). For some types of non-volatile memory devices (e.g., NAND devices), each plane includes a set of erasable blocks.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge held by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level at which a memory cell turns on or is conductive and that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings (e.g., computational or storage inefficiencies in implementing the different strategies). Aspects of the disclosure address the above-noted and other deficiencies by implementing a memory sub-system that employs die-group-based error avoidance strategies, thus significantly improving the bit error rate exhibited by the memory sub-system.

In accordance with embodiments of the disclosure, the temporal voltage shift is selectively tracked for programmed blocks grouped by block families using representative die of a die group, and appropriate voltage offsets, which are based on block affiliation with die group, are applied to the base read levels in order to perform read operations. "Die group" herein shall refer to one or more die that share one or more characteristics, such temporal voltage shift characteristics or operational temperature characteristics.

"Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any combination of these.

"Data state metric" herein shall refer to a quantity that is measured or inferred from the state of data stored on a memory device. Specifically, the data state metrics may reflect the state of the temporal voltage shift, the degree of read disturb, and/or other measurable functions of the data state. A composite data state metric is a function (e.g., a weighted sum) of a set of component state metrics.

Since the time elapsed after programming and temperature are the main factors affecting the temporal voltage shift, all die within a single die group are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

In some embodiments, dice that are to be included in a particular die group can be determined. The dice in a particular die group can share one or more characteristics, such as temporal voltage shift characteristics or operational temperature characteristics. For example, the dice in a die group can have similar values of a data state metric indicative of temporal voltage shift and experience operational temperatures on average of 70 to 75 degrees Celsius. The temporal voltage shift characteristics of a die can be determined using values of a data state metric. The operational temperature characteristics can be determined using operational temperature measurements indicative of the operational temperature of one or more dice of a memory device or memory sub-system. In some embodiments, subsequent to forming the die groups a calibration process to associate each die group with a predefined read threshold voltage offset bin can be performed from time to time. To perform a calibration process, the temporal voltage shift characteristics can be determined for one or more representative dice of a die group (e.g., rather than all the dice of the die group). The determined temporal voltage shift characteristics of the representative dice of the die group can be used to identify the predefined read threshold voltage offset bin for the die group.

The memory sub-system controller (or host system) can determine values of a data state metric that characterizes a temporal voltage shift for each of the dice of a memory device or memory sub-system. The memory sub-system controller (or host system) can determine, based on the values of the data state metric that the temporal voltage shift of an initial subset of the dice is within a range. The memory sub-system controller (or host system) can assign the initial subset of dice to an initial die group. The initial die group can correspond to an offset table of metadata that identifies read threshold voltage offsets for the initial die group.

In some embodiments, the memory sub-system controller (or host system) can determine operational temperatures of the initial subset of dice of the initial die group. Memory sub-system controller can determine that the operational temperatures for one or more of the initial subset of dice of the initial die group are within a temperature range. The one or more of the initial subset of dice from the initial die group can be removed and assigned to a new die group.

In some embodiments, the memory sub-system controller can periodically perform a calibration process in order to associate each die group with a predefined read threshold voltage offset bin, which is in turn associated with the voltage offset to be applied for read operations. "Threshold voltage offset bin" herein can refer to a set of read level offsets that are applied to a set of data. The associations of blocks with block families and block families and die groups with threshold voltage offset bins can be stored in respective metadata tables maintained by the memory sub-system controller. To perform the calibration process, the memory sub-system controller can measure the threshold voltage of one or more representative dice of the die group, rather than all the dice of the die group, because the dice of the die group exhibit similar temporal voltage shift characteristics or experience similar operation temperatures, and as such the behavior of the voltage distributions over time for some of the dice of the die group can accurately represent the voltage distribution behavior over time for all the dice of a die group. Moreover, one or more metadata tables (e.g., family table) can also be reduced in size because the metadata of die groups can be less than metadata for each die of a memory sub-system or memory device.

Therefore, advantages of the systems and methods implemented in accordance with some embodiments of the disclosure include, but are not limited to, improving the bit error rate in read operations by maintaining metadata tracking die groups that are presumed to exhibit similar voltage distributions and selectively performing calibration operations for die groups using one or more representative dice of dice of a die group, as described in more detail herein below.

FIG. 1 illustrates an example computing system 100 that includes a memory sub-system 110 in accordance with some embodiments of the disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a die group manager component 113 that can be used to implement the die group error avoidance strategies, in accordance with embodiments of the disclosure. In some embodiments, the controller 115 includes at least a portion of the die group manager component 113. For example, the controller 115 can include a processor 117 (processing device) configured to execute instructions stored in local memory 119 for performing the operations described herein. In some embodiments, the die group manager component 113 is part of the host system 120, an application, or an operating system. The die group manager component 113 can manage die groups associated with the memory devices 130, as described in more detail herein below.

Figure 2:
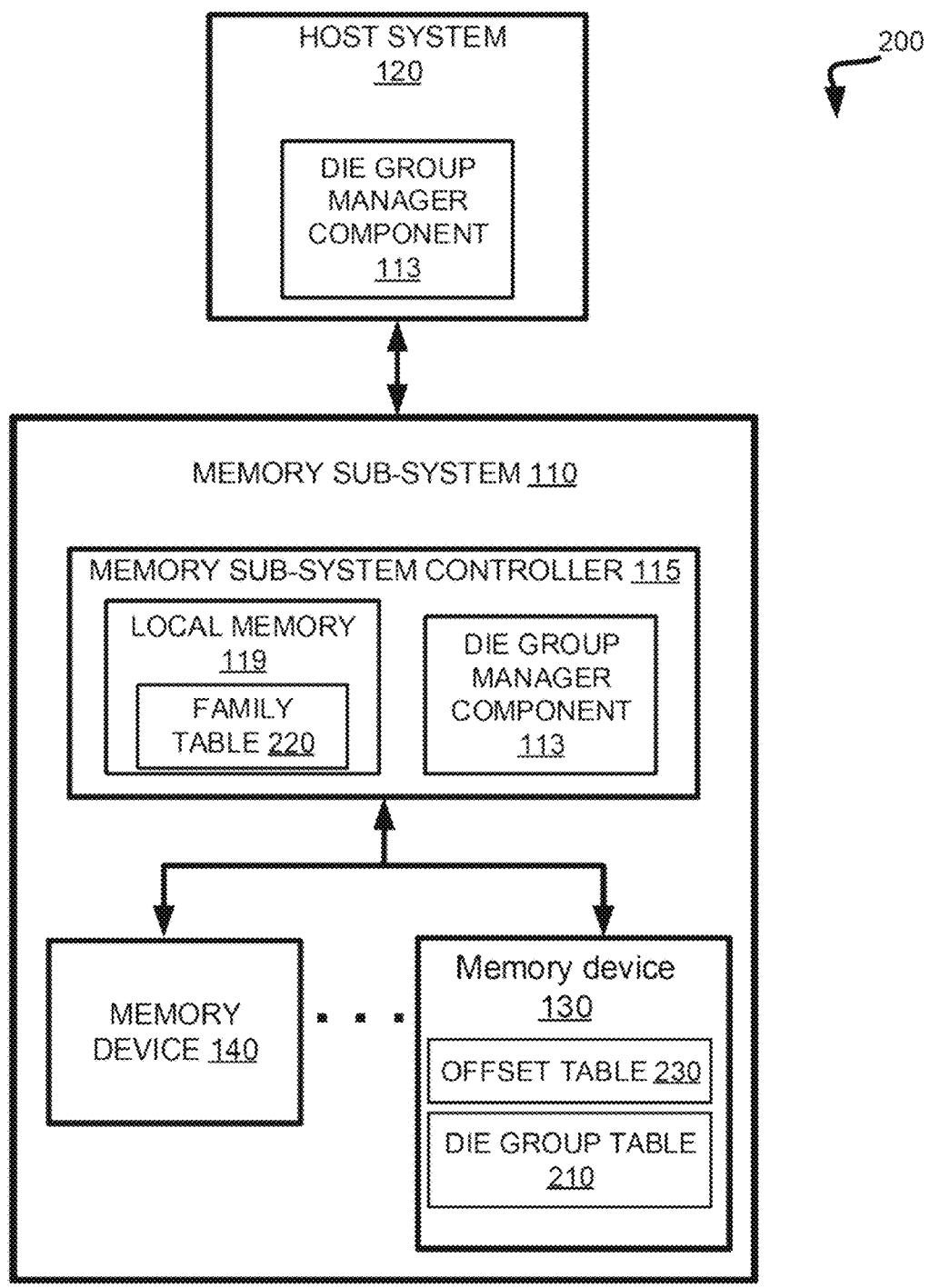
FIG. 2 illustrates an example computing system that includes a memory sub-system, in accordance with some embodiments of the disclosure.

FIG. 2 illustrates an example computing system that includes a memory sub-system, in accordance with some embodiments of the disclosure. The description of FIG. 1 and the elements therein apply to FIG. 2, unless otherwise described. Memory sub-system 110 illustrates family table 220 stored at local memory 119 of the memory sub-system controller 115 and offset table 230 and die group table 210 stored at memory device 130. Family table 220, offset table 230, and die group table 210 are further described with respect to FIG. 3.

In some embodiments, the composition of dice in one or more die groups can be determined. Grouping one or more dice to create a die group can be based on one or more of temporal voltage shift characteristics of the dice of the memory device 130 or memory sub-system 110 or the operational temperature characteristics of the dice of the memory device 130 or memory sub-system 110. In some embodiments, values of the data state metric can be indicative of the temporal voltage shift characteristics of a die. For example, the dice of a die group can have similar temporal voltage shift characteristics and operational temperature characteristics. "Operational temperature" or "operational temperature characteristics" herein can refer to the estimated temperature of a die during the operation of the memory device 130 or memory sub-system 110. In some embodiments, the operational temperature can be an estimate of the temperature of a die at a point in time or one or more windows of time (e.g., average temperature).

In some embodiments, to create the die groups (e.g., to determine the composition of dice in each die group), die group manager component 113 can determine values of a data state metric that characterizes a temporal voltage shift for each of the dice of a memory device 130 or memory sub-system 110. For example, the threshold voltages of a die can measured over time to determine a function representing the threshold voltage shift over time for a particular die. Examples of determining values of a data state metric that characterizes a temporal voltage shift are further described with respect to FIG. 5.

In some embodiments, die group manager component 113 can determine that the temporal voltage shift of a subset of the dice of the memory device 130 or memory sub-system 110 is within a range based on the values of the data state metric. In some embodiments, the values of the data state metric can be determined to be within a range. In some embodiments, the values of the data state metric can be used to derive values indicative of temporal voltage shift and the values indicative of the temporal voltage shift can be determined to be within a range. For example, the slopes of functions representing the threshold voltages over time for different die can be identified. A subset of dice that have threshold voltage slopes that are within a range (e.g., similar threshold voltage slopes) can be assigned to an initial die group. Another subset of dice that have threshold slopes that are within another range can be assigned to another die group, and so forth.

In some embodiments, the die groups can be further refined based on operational temperature characteristics. Die group manager component 113 can determine the operational temperature characteristics of dice of a die group. For example, a pre-characterization can be performed to characterize the temperature profile of one or more dice or packages of the memory sub-system. In another example, on-board temperature sensors at the board level, package level, or die level, for example, can be used to estimate or measure the temperature of the dice of the memory sub-system 110 or memory device 130 during operation.

In some embodiments, die group manager component 113 can determine that the operational temperature characteristics of one or more dice of the initial die group is within an initial temperature range. The one or more dice that are within the initial temperature range are removed from the initial die group and assigned to a new die group (e.g., third die group). In some embodiments, die group manager component 113 determines that the operational temperature characteristics for the remaining dice of the initial die group are within a different temperature range and remain assigned to the initial die group.

For example, the initial die group can include 4 dice (die 1 through die 4) that are physically spread out across the memory sub-system 110. Die 1 and die 2 have an average operating temperature of 80 degrees Celsius over a window of time, and die 3 and die 4 have an average operating temperature of 122 and 125 degrees Celsius over the window of time. Die 1 and die 2 have operational temperatures that fall within an initial temperature range (e.g., 75-85 degrees Celsius) and are assigned to a new die group. Die 3 and die 4 have operational temperatures that fall within a different temperature range (e.g., 120-130 degrees Celsius) over the window of time and remain assigned to the initial die group.

In some embodiments, for each die group one or more records can be created in metadata, and specifically in the die group table 210 that records an association between the one or more dice and the die group to which the one or more dice area assigned. In some embodiments, one or more offset tables 230 can be associated the die groups. In some embodiments, each of the die groups can be associated with a different offset table 230. Having multiple offset tables 230 that are each associated with a particular die group can allow the die groups to have read threshold bin offsets that are unique to the die group and based on the characteristics (e.g., temperature voltage shift characteristics and operational temperature characteristics) of the dice of a die group. Offset table 230 and die group table 210 are further described below with respect to FIG. 3.

In some embodiments, the die groups can be determined during a pre-characterization operation. In some embodiments, the pre-characterization operation (e.g., prior to releasing the memory sub-system 110 into the field) can be performed by die group manager component 113 executing at host system 120 or memory sub-system 110. In some embodiments, the die groups can be determined (or re-determined) based on characterization on board the memory sub-system 110. In some embodiments, the characterization on board the memory sub-system 110 can be performed dynamically (e.g., in the field), such as responsive to the satisfaction of a triggering event.

In some embodiments, responsive to determining a triggering event, die group manager component 113 determines whether a composition of dice of the die group is to be modified (or new die group created). In some embodiments the triggering event can correspond to a number of program-erase (PE) cycles of the memory device 130 (or memory sub-system 110) meeting or exceeding a threshold number of PE cycles. For example, during on-board characterization die group manager component 113 can determine that composition of dice of one or more die groups is to be modified or that one or more die groups are to be created (or removed) responsive to the number program-erase (PE) cycles performed by the memory sub-system 110 (or memory device 130) meeting or exceeding a 1000 PE cycles. One or more of the temporal voltage shift characteristics or operational temperature characteristics for the memory device 130 or memory sub-system 110 can be measured, as described above. The temporal voltage shift characteristics or operational temperature characteristics of dice of a memory sub-system 110 or memory device 130 can change over time due to wear. New die groups can be created or the composition of dice in existing die groups can be modified based on new measurements indicative of temporal voltage shift characteristics or operational temperature characteristics such that dice of a particular die group have similar temporal voltage shift characteristics or operational temperature characteristics at any point in time.

In some embodiments, die group manager component 113 can program one or more blocks at a memory device 130 or memory sub-system 110. The one or more blocks can be associated with one or more block families. The one or more blocks can be part of one or more dice of the memory device 130 or memory sub-system 110. The one or more dice can be part of a single die group or one or more die groups.

In some embodiments, a newly created block family can be associated with bin 0. Then, the memory sub-system controller 115 can periodically perform a calibration process in order to associate each die group with one of the predefined read threshold voltage offset bins (bins 0-9 in the illustrative example of FIG. 5), which are in turn associated with the read voltage offset to be applied for read operations. The associations of blocks with block families and block families and die groups with read threshold voltage offset bins can be stored in respective metadata tables maintained by the memory sub-system controller 115.

In some embodiments, die group manager component 113 can periodically perform a calibration process to determine a current read threshold voltage offset bin associated with the die group based on one or more dice that are representative of dice of the die group. Based on the calibration process, the memory sub-system controller 115 associates each die group with a read threshold voltage offset bin, which defines a set of read threshold voltage offsets to be applied to the base voltage read level in order to perform read operations. In some embodiments, the calibration process involves identifying one or more representative dice of the die group. For example, one or more dice of the die group that are representative dice of a die group can be randomly, pseudo-randomly selected, selected from an order, and so forth. In some embodiments, the die group includes multiple dice and the one or more representative dice are a subset of the dice of the die group. In some embodiments, the calibration process further involves performing, with respect to the selected representative dice of the one or more die groups, read operations utilizing different read threshold voltage offsets, in order to determine the read threshold voltage offset that minimizes the error rate of the read operation. In some embodiments, the new read threshold offset bin can be identified using the metadata, and specifically the offset table 230, as the bin having a range of read threshold voltage offsets that includes read threshold voltage offset that minimizes the error rate of the read operation. Each time the calibration processes selects a new bin (e.g., new read threshold voltage offset bin), the metadata, and specifically family table 220, can be updated or appended to reflect the change. For example, the family table 220 metadata can be appended to indicate the new read threshold voltage offset bin is associated with the die group.

In some embodiments, the calibration process (e.g., determining whether a new read threshold offset bin is to be associated with a die group) can be performed responsive to a triggering event corresponding to a counter. For example, each time a block family is programmed a counter can be initialized. The values of the counter can indicate the amount of time data that has elapsed since the data was last programmed to the respective block family. In some embodiments, a calibration process can be performed responsive to determining that the counter meets or exceeds a threshold value. For example, when the counter indicates that 10 hours has elapsed since the block family was last programmed, a calibration process can be initiated. In some embodiments, the triggering event corresponding to the counter can be a power down event that clears the counter. A power down event can include any event that clears the counter such the counter no longer can be used to accurately estimate the time that has elapsed since the corresponding block family was last programmed. Examples of a power down event can include a full shut down of the power system or a sleep power cycle that prevents the counter from performing a counting function.

FIG. 3 schematically illustrates example metadata maintained by the memory sub-system controller for associating die groups with block families, in accordance with embodiments of the disclosure. As schematically illustrated by FIG. 3, the memory sub-system controller can maintain the die group table 310, the family table 320, and the offset table 330. Die group table 310, the family table 320, and the offset table 330 can be similar to die group table 210, family table 220, and offset table 230, respectively, as described with respect to FIG. 2.

Each record of the die group table 310 specifies the die associated with the specified die group. For example, die 1 through die 5 of the memory sub-system are associated with die group A and die 62 through N are associated with die group N. In some embodiments, the die of a die group can change during the life of a memory device or memory sub-system. As such, the die group table 310 can be updated accordingly.

In some embodiments, superblock table (not shown) specifies the block family associated with the specified superblock and partition combination.

The family table 320 is indexed by the block family number, such that each record of the family table 320 specifies, for the block family referenced by the index of the record, a set of read threshold voltage offset bins associated with respective die groups. In other words, each record of the family table 320 includes a vector, each element of which specifies the read threshold voltage offset bin associated with the die group referenced by the index of the vector element. The read threshold voltage offset bins to be associated with the die groups can be determined by the calibration process, as described in more detail herein above. In some embodiments, the family table 320 can be indexed by the block number, such that each record of the family table 320 specifies, for the block family referenced by the index of the record, a set of read threshold voltage offset bins associated with respective die groups. The memory subsystem controller 115 can use a firmware data structure, such as die group table 310, to determine which die are associated with which die groups.

Finally, the offset table 330 is indexed by the read threshold voltage offset bins. Each record of the offset table 330 specifies a set of read threshold voltage offsets (e.g., for programming distribution L1 through programming distribution L7) associated with each read threshold voltage offset bin. In some embodiments, one or more die groups can have different offset tables. For example, each die group can have an offset table that is specific to the particular die group. Having different offset tables for different die groups allows for unique bin offsets for each die group.

The metadata tables 310-330 can be stored at one or more memory devices 130 of FIG. 1 or 2. In some implementations, at least part of the metadata tables can be cached in the local memory 119 of the memory sub-system controller 115 of FIG. 1 or 2.

In operation, upon receiving a read command, the memory sub-system controller determines the physical address corresponding to the logical block address (LBA) specified by the read command. Components of the physical address, such as the physical block number and the die identifier (identified using the LBA), are utilized for performing the metadata table walk: first, the superblock table (not shown) is used to identify the block family identifier corresponding to the physical block number; then, a die group table 310 is used to determine which die group is associated with a die associated with the physical block number; then, the block family identifier is used as the index to the family table 320 in order to determine the read threshold voltage offset bin associated with the block family and the die group; finally, the identified read threshold voltage offset bin is used as the index to the offset table 330 in order to determine the read threshold voltage offset corresponding to the bin for each of the programing distributions. The memory sub-system controller can then additively apply the identified read threshold voltage offset to the base voltage read level in order to perform the requested read operation.

In the illustrative example of FIG. 3, the superblock table maps partition 0 of the superblock 0 to block family 4, which is utilized as the index to the family table 320 in order to determine that die group A is mapped to bin 1. The latter value is used as the index to the offset table 330 in order to determine the threshold voltage offset values for bin 1. Die group table 310 can be used to determine which die are in die group 1.

Figure 4:
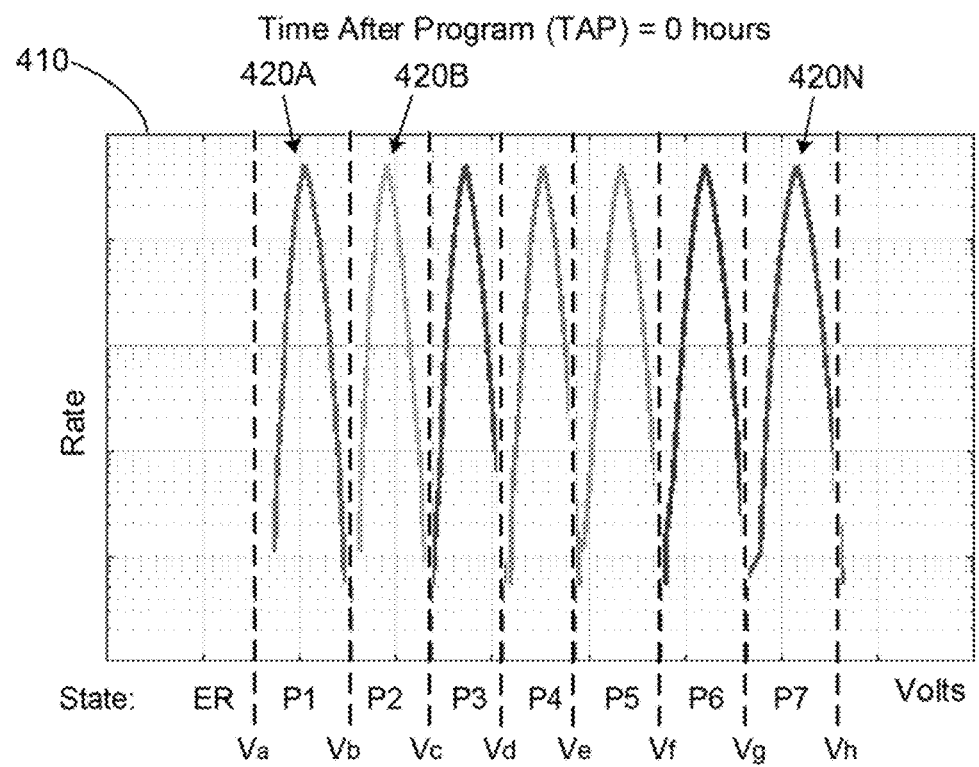
FIG. 4 illustrates the temporal voltage shift caused at least in part by the slow charge loss exhibited by triple-level memory cells, in accordance with embodiments of the disclosure.
Figure 4:
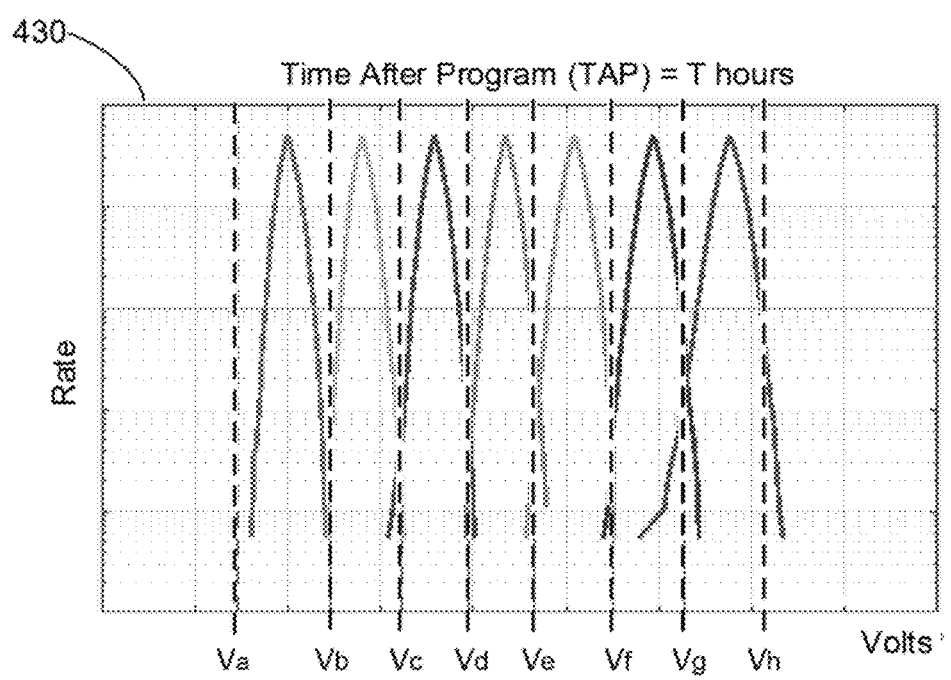

FIG. 4 illustrates the temporal voltage shift caused at least in part by the slow charge loss exhibited by triple-level memory cells, in accordance with embodiments of the disclosure. While the illustrative example of FIG. 4 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 410 and 430 illustrate program voltage distributions 420A-420N (also referred to as "program distributions" or "voltage distributions" or "distributions" herein) of memory cells programmed by a respective write level (which can be assumed to be at the midpoint of the program distribution) to encode a corresponding logical level ("000" through "111" in case of a TLC). The program distributions 420A through 420N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

As seen from comparing example charts 410 and 430, which reflect the time after programming (TAP) of 0 (immediately after programming) and the TAP of T hours (T=some positive number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 5:
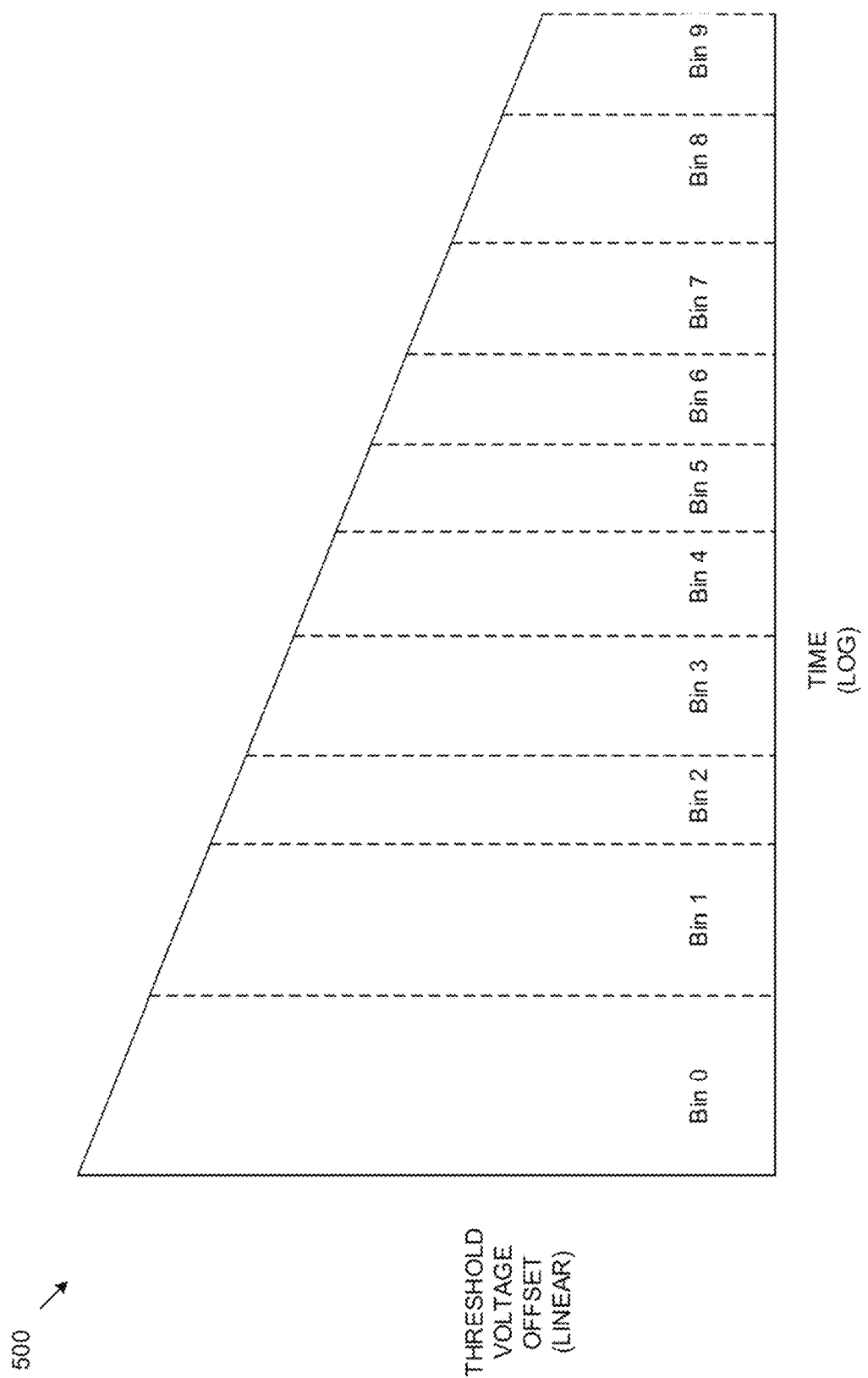
FIG. 5 illustrates a graph representing time voltage shift and a set of predefined threshold voltage offset bins, in accordance with embodiments of the disclosure.

FIG. 5 illustrates a graph representing time voltage shift and a set of predefined threshold voltage offset bins (bin 0 to bin 9), in accordance with embodiments of the disclosure.

The threshold voltage offset graph 500 can be subdivided into multiple threshold voltage offset bins, such that each bin corresponds to a predetermined range of threshold voltage offsets. While the illustrative example of FIG. 5 defines ten bins, in other embodiments, various other numbers of bins can be employed (e.g., 64 bins). Based on a periodically performed calibration process, the memory sub-system controller associates each die group with a threshold voltage offset bin, which defines a set of threshold voltage offsets to be applied to the base voltage read level in order to perform read operations, as described in more detail herein above.

As illustrated by graph 500, the time voltage shift is represented by the change in (e.g., downward slope) the threshold voltage offset over time. It can be noted that the y-axis representing the threshold voltage offset is linear and the x-axis representing time is logarithmic. The function of threshold voltage offset over time can be represented by a logarithmic-linear threshold voltage offset line as illustrated in graph 500.

The logarithmic-linear behavior of the threshold voltage over time can be used to characterize the temporal voltage shift of a die (or die group). For example, the threshold voltages of one or more voltage distributions of a die can be measured at two different times, for example at time 0 (0 minutes after program) and time 1 (10 minutes after program). Using the two data points (e.g., threshold voltage at time 0 and threshold voltage at time 1), the function of the threshold voltage over time can be determined (e.g., function of a line using two points). In other embodiments, more complex techniques such as curve fitting techniques or linear extrapolation can be used to determine the threshold voltage over time for a particular die. In some embodiments, to determine die groups, die that have similar slopes (e.g. similar curves) are grouped in the same die group. That is, the die that have similar temperature voltage shift characteristics can be grouped in the same die group.

The method 600 or 700 as described below can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 600 or 700 is performed by the die group manager component 113 of FIG. 1 or 2. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

Figure 6:
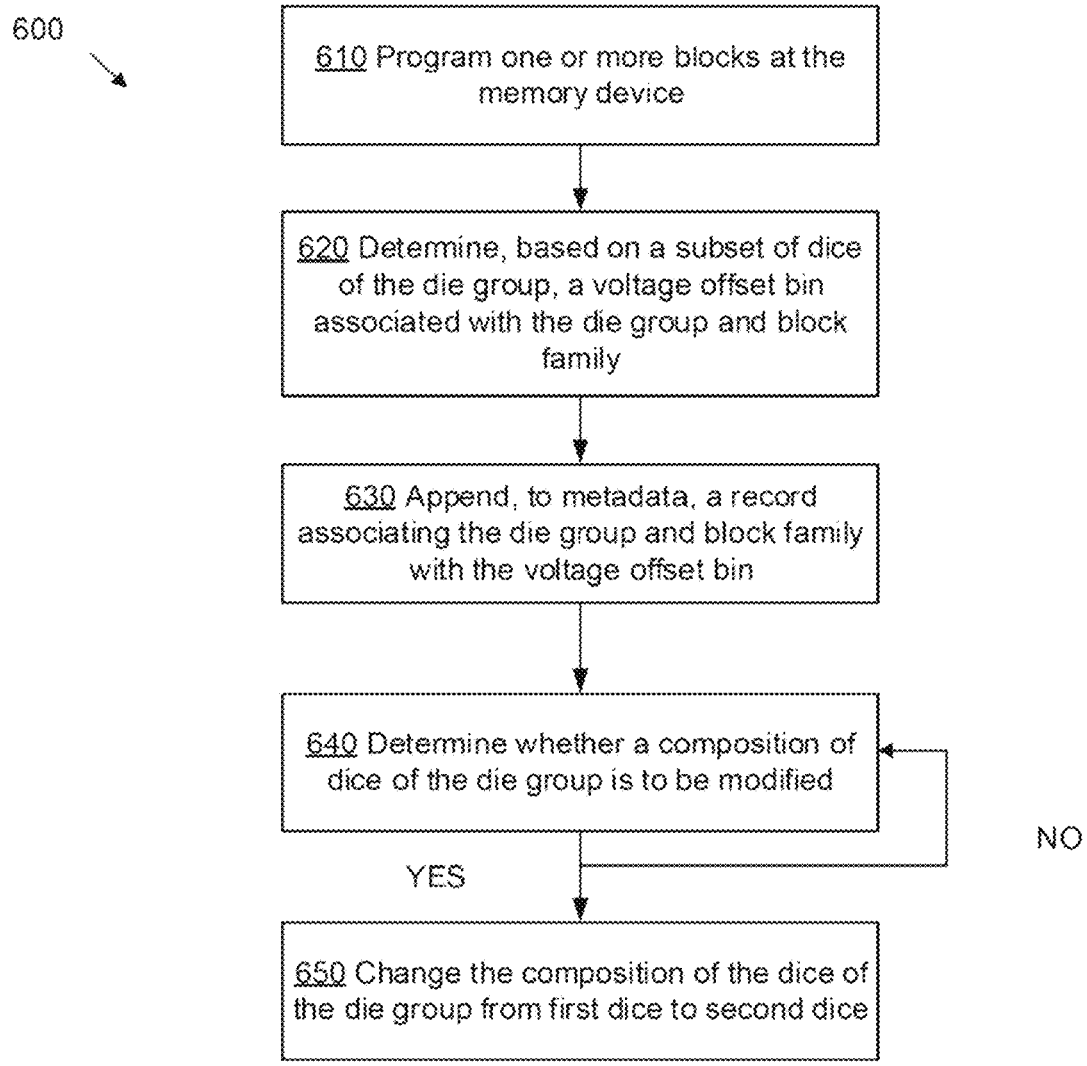
FIG. 6 is a flow diagram of an example method of die group management implemented by a memory sub-system controller operating, in accordance with some embodiments of the disclosure.

FIG. 6 is a flow diagram of an example method 600 of die group management implemented by a memory sub-system controller operating in accordance with some embodiments of the disclosure.

At operation 610, the processing logic of the memory sub-system controller programs one or more blocks at the memory device. In some embodiments, the one or more blocks are associated with a block family and with one or more dice of a die group.

At operation 620, processing logic determines, based on a subset of dice of the die group, a voltage offset bin associated with the die group and block family. In some embodiments, the determination can be made based on one or more dice that are representative of dice of the die group. In some embodiments, the die group includes multiple dice. The one or more representative dice are a subset of the dice of the die group.

In some embodiments, to determine the voltage offset bin associated with the die group, processing logic determines a read threshold voltage offset for the subset of dice of the die group. Processing logic identifies, based on the read threshold voltage offset for the subset of dice of the die group, the voltage offset bin from an offset table of the metadata.

In some embodiments, to determine the voltage offset bin associated with the die group is responsive to detecting a triggering event. In some embodiments, the triggering event corresponds to one of the counter meeting or exceeding a threshold value or a power down event that clears the counter.

At operation 630, processing logic appends, to metadata associated with the memory device, a record associating the die group and block family with the voltage offset bin.

At operation 640, processing logic determines whether a composition of dice of the die group is to be modified. In some embodiments, the determination is responsive to detecting a triggering event (e.g., number of PE cycles). In some embodiments, the triggering event corresponds to a number of program-erase (PE) cycles of the memory device meeting or exceeding a threshold number of PE cycles.

In some embodiments, to determine whether the composition of dice of the die group is to be modified, processing logic determines values of a data state metric that characterize a temporal voltage shift for each of the initial dice of the die group. Processing logic determines, based on the values of the data state metric, that the temporal voltage shift of one or more of the initial dice of the die group is outside a range. Responsive to determining that the temporal voltage shift of the one or more of the initial dice of the die group is outside the range, processing logic removes the one or more of the initial dice from the die group.

In some embodiment, to determine whether the composition of dice of the die group is to be modified, processing logic determines other values of the data state metric that characterize a temporal voltage shift for each of other dice that are not part of the die group. Processing logic determines, based on the other values of the data state metric that the temporal voltage shift of one or more of the other dice is within the range. Responsive to determining that the temporal voltage shift of the one or more of the other dice is within the range, processing logic adds the one or more of the other dice to the die group.

In some embodiments, to determine whether the composition of dice of the die group is to be modified, processing logic determines operational temperatures of the initial dice of the die group. Processing logic determines that the operation temperatures for one or more of the initial dice of the die group is outside a temperature range. Responsive to determining that the operation temperatures for the one or more of the initial dice of the die group is outside the temperature range, processing logic removes the one or more of the initial dice from the die group.

Responsive to determining that the composition of dice of the die group is to be modified, processing logic proceeds to operation 650. Responsive to determining that the composition of the dice of the die group is not to be modified, processing logic returns to operation 640 (e.g., waits for another triggering event).

At operation 650, processing logic, changes the composition of the dice of the die group from initial dice to different dice. In some embodiments, the changing is performed responsive to determining that the die group is to be modified.

Figure 7:
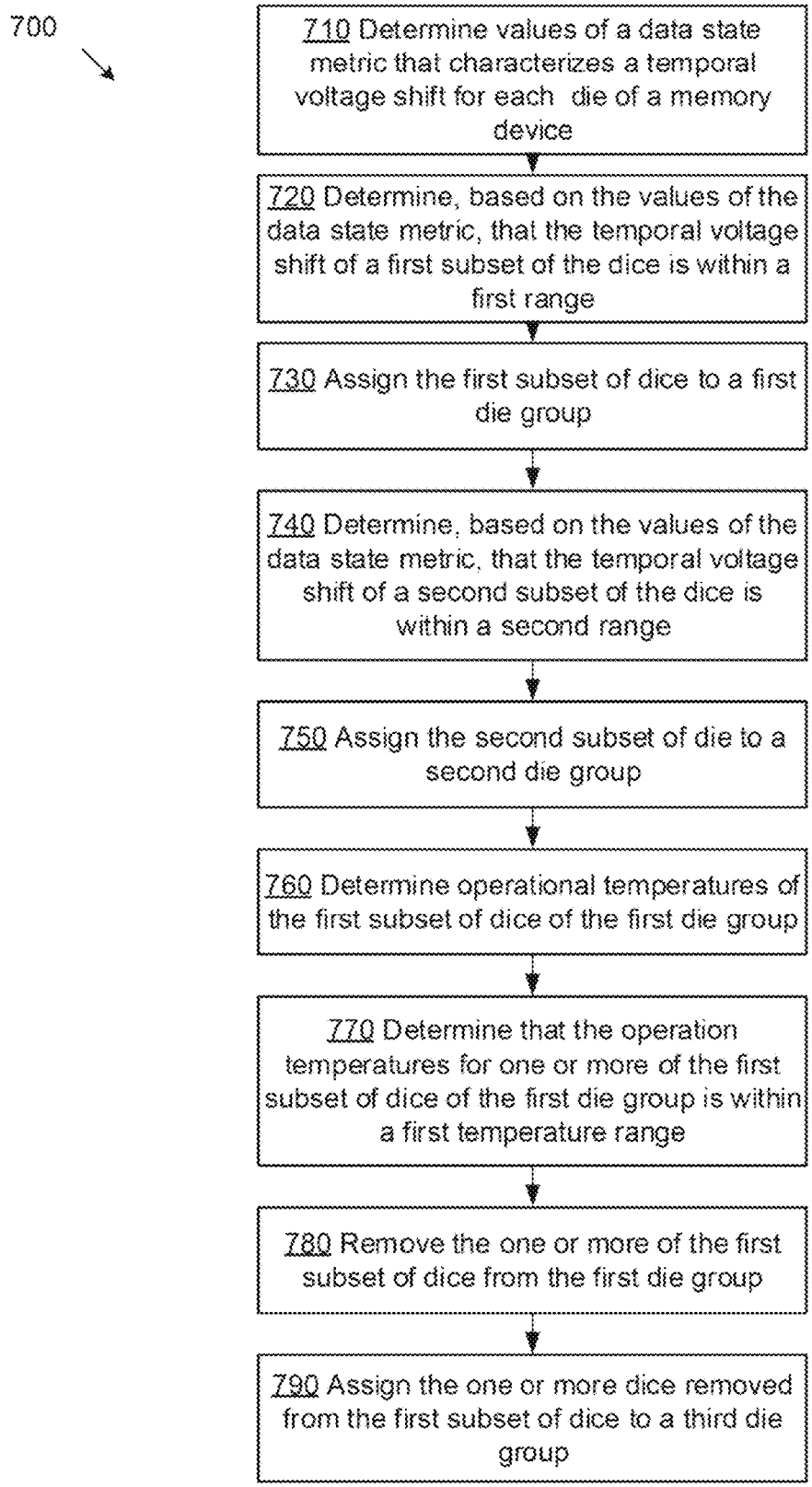
FIG. 7 is a flow diagram of an example method of determining die groups, in accordance with some embodiments of the disclosure.

FIG. 7 is a flow diagram of an example method 700 of determining die groups, in accordance with some embodiments of the disclosure. At operation 710, processing logic determines values of a data state metric that characterizes a temporal voltage shift for each die of a memory device (or memory sub-system).

At operation 720, processing logic determines, based on the values of the data state metric that the temporal voltage shift of an initial subset of the dice is within a range.

At operation 730, processing logic assigns the initial subset of dice to the initial die group. The initial die group corresponds to an offset table of metadata that identifies read threshold voltage offsets for the initial die group.

At operation 740, processing logic determines, based on the values of the data state metric, that the temporal voltage shift of another subset of the dice is within another range.

At operation 750, processing logic assigns the other subset of die to another die group. The initial die group and the other die group correspond to different offset tables that identify different read threshold voltage offsets.

At operation 760, processing logic determines operational temperatures of the initial subset of dice of the initial die group.

At operation 770, processing logic determines that the operation temperatures for one or more of the initial subset of dice of the initial die group is within a temperature range.

At operation 780, processing logic removes the one or more of the initial subset of dice from the initial die group.

At operation 790, processing logic assigns the one or more dice removed from the initial subset of dice to still another die group.

In some embodiments, processing logic determines that the operational temperatures for remaining dice of the initial subset of dice of the initial die group are within a different temperature range. The remaining dice remain assigned to the initial die group.

Figure 8:
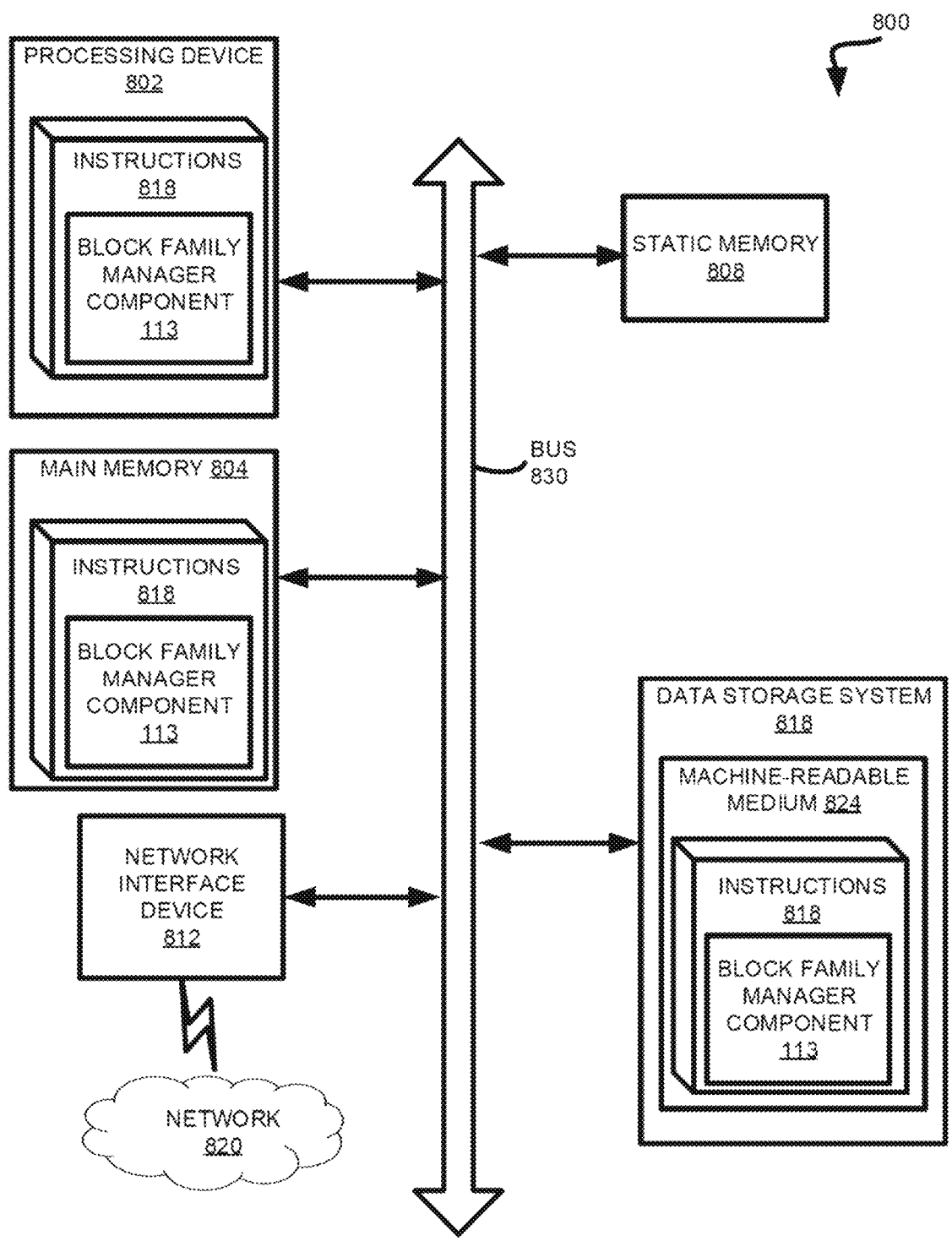
FIG. 8 is a block diagram of an example computer system in which embodiments of the disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1 or 2) that includes, is coupled to, or utilizes a memory sub-system (e.g., the memory sub-system 110 of FIG. 1 or 2) or can be used to perform the operations of a controller (e.g., to execute an operating system to perform operations corresponding to the die group manager component 113 of FIG. 1 or 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein. The computer system 800 can further include a network interface device 812 to communicate over the network 820.

The data storage system 818 can include a machine-readable storage medium 824 (also known as a computer-readable medium) on which is stored one or more sets of instructions 828 or software embodying any one or more of the methodologies or functions described herein. The instructions 828 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1 or 2.

In one embodiment, the instructions 828 include instructions to implement functionality corresponding to the die group manager component 113 of FIG. 1 or 2. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:

programming one or more blocks at the memory device, wherein the one or more blocks are associated with a block family and with one or more dice of a die group comprising a plurality of dice;

determining, based on a subset of dice of the die group, a voltage offset bin associated with the plurality of dice in the die group and with the block family; and appending, to metadata associated with the memory device, a record associating the die group and the block family with the voltage offset bin.

2. The system of claim 1, wherein to determine the voltage offset bin associated with the die group, the processing device is further to perform the operations comprising:

determining a read threshold voltage offset for the subset of dice of the die group; and identifying, based on the read threshold voltage offset for the subset of dice of the die group, the voltage offset bin from an offset table of the metadata.

3. The system of claim 1, wherein determining the voltage offset bin associated with the die group is performed responsive to detecting a first triggering event.

4. The system of claim 3, wherein the first triggering event corresponds to one of: a counter meeting or exceeding a threshold value or a power down event that clears the counter.

5. The system of claim 1, wherein the processing device is further to perform the operations comprising:

responsive to detecting a second triggering event, determining whether a composition of dice of the die group is to be modified; and responsive to determining that the die group is to be modified, changing the composition of the dice of the die group from a first plurality of dice to a second plurality of dice.

6. The system of claim 5, wherein detecting the second triggering event further comprises: determining that a number of program-erase (PE) cycles of the memory device meets or exceeds a threshold number of PE cycles.

7. The system of claim 5, wherein to determine whether the composition of dice of the die group is to be modified, the processing device is to perform the operations comprising:

determining values of a data state metric that characterize a temporal voltage shift for each of the first plurality of dice of the die group;

determining, based on the values of the data state metric, that the temporal voltage shift of one or more of the first plurality of dice of the die group is outside a range; and responsive to determining that the temporal voltage shift of the one or more of the first plurality of dice of the die group is outside the range, removing the one or more of the first plurality of dice from the die group.

8. The system of claim 7, wherein to determine whether the composition of dice of the die group is to be modified, the processing device is further to perform the operations comprising:

determining other values of the data state metric that characterize a temporal voltage shift for each of a third plurality of dice that are not part of the die group;

determining, based on the other values of the data state metric, that the temporal voltage shift of one or more of the third plurality of dice is within the range; and responsive to determining that the temporal voltage shift of the one or more of the third plurality of dice is within the range, adding the one or more of the third plurality of dice to the die group.

9. The system of claim 7, wherein to determine whether the composition of dice of the die group is to be modified, the processing device is further to perform the operations comprising:

determining operational temperatures of the first plurality of dice of the die group;

determining that the operation temperatures for one or more of the first plurality of dice of the die group is outside a temperature range; and responsive to determining that the operation temperatures for the one or more of the first plurality of dice of the die group is outside the temperature range, removing the one or more of the first plurality of dice from the die group.

10. A method comprising:

determining values of a data state metric that characterizes a temporal voltage shift for each of a plurality of dice of a memory device;

determining, based on the values of the data state metric, that the temporal voltage shift of a first subset of the plurality of dice is within a first range; and assigning, by a processing device, the first subset of dice to a first die group, wherein the first die group corresponds to an offset table of metadata that identifies read threshold voltage offsets for the first die group.

11. The method of claim 10, further comprising:

determining, based on the values of the data state metric, that the temporal voltage shift of a second subset of the plurality of dice is within a second range; and assigning the second subset of die to a second die group, wherein the first die group and the second die group correspond to different offset tables that identify different read threshold voltage offsets.

12. The method of claim 10, further comprising:

determining operational temperatures of the first subset of dice of the first die group;

determining that the operation temperatures for one or more of the first subset of dice of the first die group is within a first temperature range; and removing the one or more of the first subset of dice from the first die group.

13. The method of claim 12, further comprising:

assigning the one or more dice removed from the first subset of dice to a third die group.

14. The method of claim 12, further comprising:

determining that the operational temperatures for remaining dice of the first subset of dice of the first die group are within a second temperature range, wherein the remaining dice remain assigned to the first die group.

15. A non-transitory computer-readable medium comprising instruction that, responsive to execution by a processing device, cause the processing device to perform operations comprising:

programming one or more blocks at a memory device, wherein the one or more blocks are associated with a block family and with one or more dice of a die group comprising a plurality of dice;

determining, based on a subset of dice of the die group, a voltage offset bin associated with the plurality of dice in the die group and with the block family; and appending, to metadata associated with the memory device, a record associating the die group and the block family with the voltage offset bin.

16. The non-transitory computer-readable medium of claim 15, wherein to determine the voltage offset bin associated with the die group, the operations further comprising:

determining a read threshold voltage offset for the subset of dice of the die group; and identifying, based on the read threshold voltage offset for the subset of dice of the die group, the voltage offset bin from an offset table of the metadata.

17. The non-transitory computer-readable medium of claim 15, the operations further comprising:

responsive to detecting a triggering event, determining whether a composition of dice of the die group is to be modified; and responsive to determining that the die group is to be modified, changing the composition of the dice of the die group from a first plurality of dice to a second plurality of dice.

18. The non-transitory computer-readable medium of claim 17, wherein to determine whether the composition of dice of the die group is to be modified, the operations further comprising:

determining values of a data state metric that characterize a temporal voltage shift for each of the first plurality of dice of the die group;

determining, based on the values of the data state metric, that the temporal voltage shift of one or more of the first plurality of dice of the die group is outside a range; and responsive to determining that the temporal voltage shift of the one or more of the first plurality of dice of the die group is outside the range, removing the one or more of the first plurality of dice from the die group.

19. The non-transitory computer-readable medium of claim 18, wherein to determine whether the composition of dice of the die group is to be modified, the operations further comprising:

determining operational temperatures of the first plurality of dice of the die group;

determining that the operation temperatures for one or more of the first plurality of dice of the die group is outside a temperature range; and responsive to determining that the operation temperatures for the one or more of the first plurality of dice of the die group is outside the temperature range; removing the one or more of the first plurality of dice from the die group.

20. The non-transitory computer-readable medium of claim 18, wherein to determine whether the composition of dice of the die group is to be modified, the operations further comprising:

determining other values of the data state metric that characterize a temporal voltage shift for each of a third plurality of dice that are not part of the die group;

determining, based on the other values of the data state metric, that the temporal voltage shift of one or more of the third plurality of dice is within the range; and responsive to determining that the temporal voltage shift of the one or more of the third plurality of dice is within the range, adding the one or more of the third plurality of dice to the die group.

\* \* \* \* \*